United States Patent [19]

Vink et al.

[11] Patent Number: 5,592,316

[45] Date of Patent: Jan. 7, 1997

[54] METHOD OF MAKING AN ELECTRO-OPTIC DISPLAY DEVICE WITH POROUS SUB-LAYER

[75] Inventors: Teunis J. Vink; Willem Walrave, both of Eindhoven, Netherlands

[73] Assignee: U.S. Philips Corporation, New York, N.Y.

[21] Appl. No.: 116,381

[22] Filed: Sep. 2, 1993

[30] Foreign Application Priority Data

Sep. 8, 1992 [EP] European Pat. Off. ............. 92202711

[51] Int. Cl.⁶ .................... G02F 1/1333; G02F 1/1335; G02F 1/13
[52] U.S. Cl. .................... 349/187; 349/110; 349/113
[58] Field of Search .......................... 359/67, 70

[56] References Cited

U.S. PATENT DOCUMENTS 4,158,484  6/1979  Nishiyama ............................. 359/70

5,311,338  5/1994  Kim et al. ............................. 359/67

FOREIGN PATENT DOCUMENTS 63-77018   4/1988   Japan ......................... 359/70
2-306222  12/1990   Japan ......................... 359/67
3-256025  11/1991   Japan ......................... 359/70

Primary Examiner—Anita Pellman Gross
Assistant Examiner—Ron Trice
Attorney, Agent, or Firm—Michael E. Schmitt

[57] ABSTRACT

In an LCD internal reflections are reduced by giving the inner side of a metal pattern functioning, for example as a light shield (black matrix) a porous structure. The porous structure is obtained by means of a sputtering process in which the sputtering pressure is increased for providing the porous sub-layer, while the layer is etched and/or oxidized to obtain a satisfactory density.

14 Claims, 1 Drawing Sheet

METHOD OF MAKING AN ELECTRO-OPTIC DISPLAY DEVICE WITH POROUS SUB-LAYER

BACKGROUND OF THE INVENTION

The invention relates to a display device comprising an electro-optical display medium between two supporting plates, at least one supporting plate being provided with a picture electrode and a metal pattern which is light-reflecting at the side facing the supporting plate.

The invention also relates to the manufacture of a metal pattern on a supporting plate; such a supporting plate may comprise switching elements such as diodes, transistors etc. and also electrodes which may function as picture electrodes in a display device.

A display device of this type is suitable for displaying video information and alpha-numerical information by means of electro-optical display media such as liquid crystalline materials.

A display device of the type described in the opening paragraph is known from JP-A 3-256025. This document describes a liquid crystal display device in which a metal pattern constituting a black matrix is provided on one of the supporting plates. The metal pattern is formed from a layer of highly reflecting material such as aluminium. Incident light is reflected at the location of the black matrix so that it cannot be incident on the switching elements arranged opposite this black matrix, which elements are usually light-sensitive. The metal pattern is coated with a layer of chromium oxide to prevent unwanted reflections in the layer of liquid crystalline material so that a better contrast is obtained.

A drawback of such a structure of the black matrix pattern of two layers is that this pattern may become relatively thick (approximately 0.5 μm), which leads to poor step coverages of electrodes which may be provided at a later stage. The provision of colour filters, orienting layers or protective layers may also give rise to problems in the case of a large thickness.

Moreover, the layer of chromium oxide provided on the metal pattern has a reflective power of approximately 10% so that not all consequences of internal reflections are eliminated. Notably in the case of use in projection display devices such a quantity of light may be incident on the switching elements that, for example leakage currents are introduced. Also the contrast may be detrimentally influenced by internal reflections.

In addition, problems occur in the manufacture of such double layers, notably when chromium oxide is provided by means of reactive sputtering. Without a very accurate process control, areas with a colour different from black may be produced in the layer of chromium oxide (discolouration).

OBJECTS AND SUMMARY OF THE INVENTION

It is, inter alia, an object of the invention to provide measures by which one or more of the above-mentioned problems are considerably reduced or eliminated.

To this end a display device according to the invention is characterized in that the metal pattern has a porous sub-layer at least at the side remote from the supporting plate. In a preferred embodiment the porous sub-layer comprises the metal of the metal pattern. The reflection coefficient of the pattern at the side remote from the supporting plate is preferably at most 10%.

In the porous sub-layer incident light is absorbed in such a way that the reflective power of the metal pattern is decreased to a value of 5% or less (to approximately 2 to 3%). The reflections still occurring in the porous sub-layer are substantially completely specular so that there is no scattering towards proximate switching elements. To this end the metal layer preferably has a porosity of at least 50%. In this way detrimental effects due to internal reflections are considerably reduced. The porosity is measured over a thickness of 100 nm from the surface.

As will be further described, a porous sub-layer may be obtained by means of a sputtering process. After the sub-layer has been provided, the reflective power may even be further decreased by etching the sputtered material in a standard wet-chemical etchant suitable for the material used or by oxidizing it in, for example an oxygen plasma. In this connection, notably high-melting point metals such as, for example chromium, tungsten, molybdenum and tantalum are very suitable.

The metal pattern provided in this way may be very thin (0.2 to 0.3 μm) so that the above-mentioned step coverage problems are largely prevented. The metal pattern is then present on the "active" supporting plate. A light-melting point metal is preferably chosen for the metal pattern in this case. These metals have the advantage that the reflection coefficient does not change or hardly changes during further processing of the (active) supporting plate.

In a method of providing a metal pattern according to the invention a (high-melting point) metal is deposited by means of sputtering and the sputtering pressure is increased for providing the porous sub-layer, whereafter the porous sub-layer is etched (and/or oxidized).

Since not very critical parameters (such as sputtering pressure, etching period and/or oxidation time) are varied during this process, the method is very flexible. The provision of a layer of chromium oxide by means of sputtering (reactive sputtering in oxygen) requires a much more complex process control.

BRIEF DESCRIPTION OF THE DRAWINGS

These and other aspects of the invention will be apparent from and elucidated with reference to an embodiment described hereinafter and elucidated with reference to the drawing, which.

DESCRIPTION OF THE PREFERRED EMBODIMENTS

Figure 1:
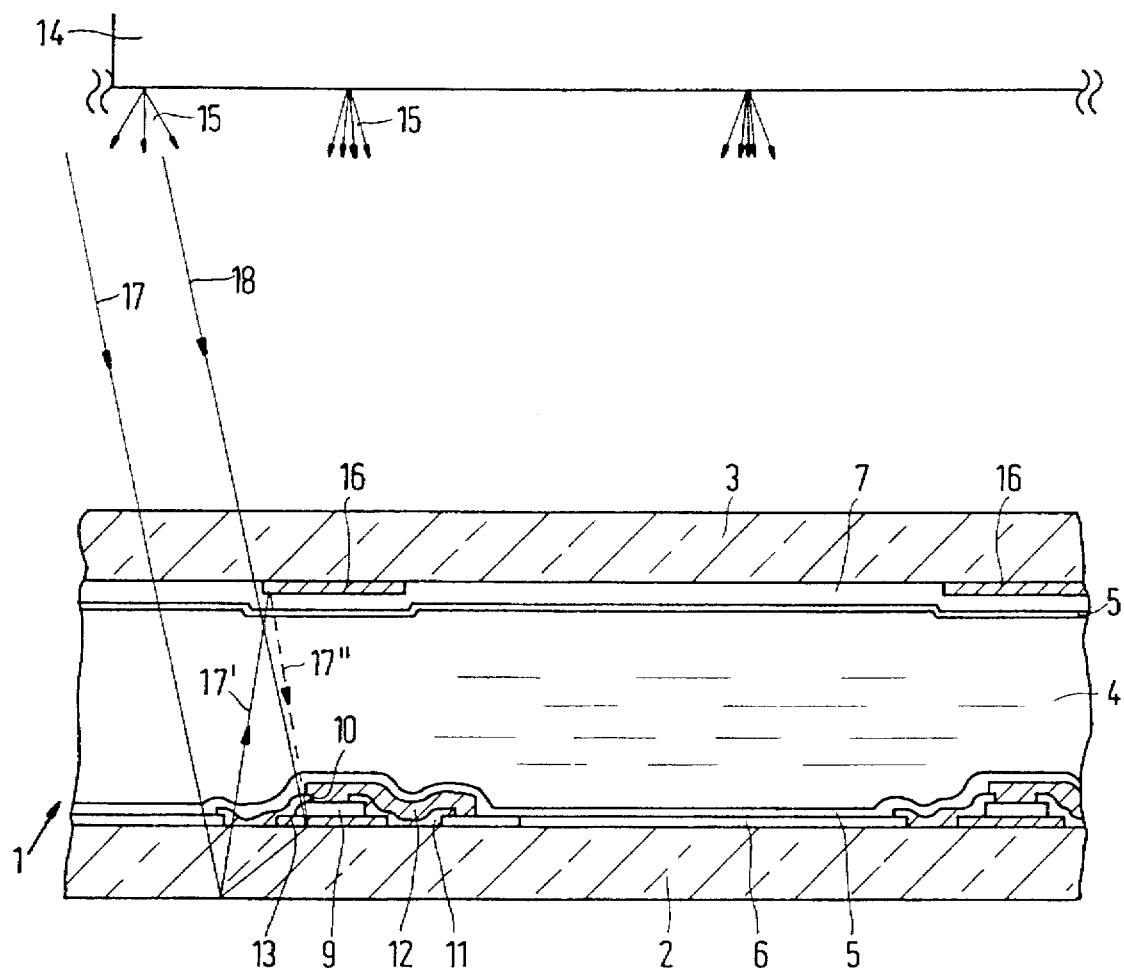
FIG. 1 is a diagrammatic cross-section of a part of a display device according to the invention.

FIG. 1 is a diagrammatic cross-section of a part of a display device according to the invention. This device is a liquid crystal display device 1 having two transparent supporting plates 2 and 3 of glass or quartz between which, for example a twisted nematic liquid crystalline material 4 is present. A plurality of picture electrodes 6 of indium-tin oxide or another electrically conducting transparent material is arranged in rows and columns on the supporting plate 2. A transparent counterelectrode 7 of, for example indium-tin oxide defining the pixels of the display device together with facing picture electrodes is present on the other supporting plate 3. The picture electrodes 6 of the pixels are connected via switches 9, in this embodiment thin-film transistors, to column electrodes, (not shown). For this purpose, the thin-film transistors are contacted via contact apertures 10 in an insulating layer 11 by means of contact conductors 12 which also contact the picture electrodes 6. The thin-film transistors are contacted at the lower side by electrodes 13, for example gate electrodes which may be integrated to row electrodes. The inner surfaces of the supporting plates (including picture electrodes, switching elements etc.) are provided with orienting layers 5 in generally known manner. The display device may be realised as a transmissive or reflective device and may be provided with, for example polarizers.

A colour filter may also be present on the supporting plate 3. The relevant Figure shows a monochrome display device for projection purposes. In such a device use is made of a light source 14 which emits a beam of light which is as parallel as possible perpendicularly to the plane of the supporting plates (possibly via a system of lenses). The light is then blocked between the pixels by the black matrix 16 provided at the inner side of supporting plate 3, which matrix is reflecting at the side of the light source 14 in the relevant embodiment. No light is transmitted between the pixels and consequently possible light-sensitive elements located on the supporting plate 2 opposite the black matrix are protected against incident light, while less well-defined states between the pixels are not visible, which has a contrast-raising effect.

However, in practice the light is emitted as a slightly diverging beam (with an apex angle of approximately 15 degrees). This is diagrammatically shown in FIG. 1 by means of the arrows 15. This means that light which is passed at the location of a light-transmissive pixel and which follows, for example the light path denoted by the arrow 17 is partially reflected at the glass-air interface. This partially reflected light (arrow 17') may subsequently be incident on the side of the black matrix remote from the supporting plate 3 and without special measures it may be incident on the light-sensitive switch 9 (arrow 17") via reflection on this black matrix. In extreme cases light emitted by the light source 14 may even be directly incident on this switching element (arrow 18). In this respect it is to be noted that the effect of reflections on the intermediate layers 5, 6, 7 and 11 has not been considered for the sake of clarity.

Figure 2:
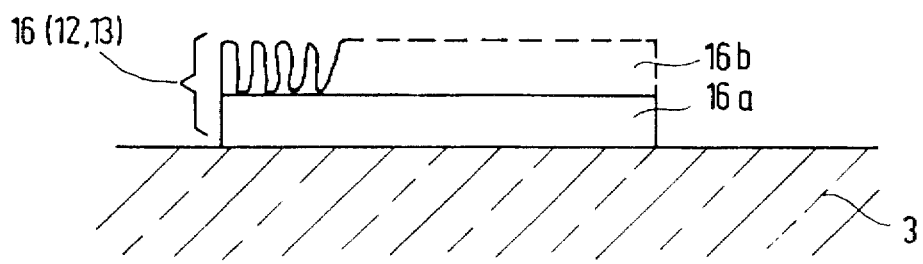
FIG. 2 is a diagrammatic cross-section of a possible implementation of a metal pattern.

According to the invention, light reflections are prevented by the black matrix 16 at the side remote from the supporting plate 3 by providing the metal layer from which the black matrix is formed with a porous sub-layer at this side. This is further illustrated in FIG. 2 showing a cross-section of a part of such a black matrix 16 which comprises a first sub-layer $16^a$ of, for example chromium and a second porous sub-layer $16^b$, also of chromium. The porous sub-layer has a reflective power of 5% or less, so that reflection towards the light-sensitive switching elements hardly occurs. Possible reflections which are directly incident can be absorbed by realising the metallization pattern 12 also as such an assembly of sub-layers. The metallization 13 for the gate electrodes may also be formed as such a double layer and constitute a light shield. Even if the switching elements 9 are not contacted at their lower side, it may be advantageous to provide a light shield on the supporting plate 2. Also in passive display devices (without switching elements) a black matrix as described above may contribute to an enhancement of the contrast.

As described, the black matrix comprises a first sub-layer $16^a$ of chromium provided with a second porous sub-layer $16^b$, also of chromium. The first sub-layer has a thickness of 100 nanometer, while the thickness of the second sub-layer is 150 nanometer. At such thicknesses no or hardly any step coverage problems occur. Said reflection coefficient of 5% or less is obtained at a porosity of the second sub-layer of 50% or more. Instead of chromium, other (high-melting point) metals may alternatively be chosen, such as tungsten, molybdenum or tantalum.

Such a metal pattern which reflects light incident at one side and which substantially completely absorbs light incident at the other side may be manufactured as follows.

Chromium is sputtered in an argon atmosphere on a glass supporting plate 3 (which may already be provided with picture electrodes and/or switching elements) at such a sputtering gas pressure that the mechanical stress in the layer is slightly compressive. The columns from which the resultant sub-layer $16^a$ is built up are situated close together. Subsequently, the sputtering gas pressure is considerably increased (by a factor of approximately 10). The composite columns of the sub-layer formed thereby are now spaced apart (FIG. 2) so that the sub-layer $16^b$ has a high porosity. Subsequently, the metal layer 16 is etched in the desired pattern.

The porosity of the sub-layer $16^b$ can be increased by etching in a standard wet-chemical etching bath. The light-absorbing power can be further increased by oxidizing the porous sub-layer in, for example an oxygen plasma; etching may then be dispensed with.

The invention is of course not limited to the embodiment described, but several variations are possible. For example, the black matrix 16 in FIG. 1 may alternatively be provided on the electrode 7. The metal layer 16 (12, 13) may comprise an extra sub-layer having a different porosity or a gradually increasing porosity. Since the electric conductance of a metal track with one or more of such sub-layers remains very satisfactory, conducting parts other than the black matrix can also be realised by means of such a metal pattern, such as connection conductors which usually partly cover the (light-sensitive) transistors or other switching elements so that the consequences of internal reflections are also inhibited at these areas.

What is claimed is:

1. A method of providing a supporting plate with a metal pattern which is light-reflective at the side facing the supporting plate and light-absorbing at the other side, the metal pattern having a porous upper layer, the method comprising depositing the metal by sputtering, increasing the sputtering pressure during deposition to provide the porous upper layer, and etching the porous upper layer after sputtering.

2. The method of claim 1, further comprising the step of selecting the metal from at least one of chromium, tungsten, molybdenum or tantalum.

3. The method of claim 2, wherein the sputtering step comprises using only one metal.

4. The method of claim 1, further comprising employing the metal pattern as connection metallization of at least one of a switching element or a picture element.

5. The method of claim 1, wherein the sputtering and etching steps are performed so as to provide a porous upper layer having reflectivity of about 5% or less.

6. The method of claim 1, wherein the sputtering and etching steps are performed so as to form a porous upper layer having a thickness of approximately 150 nanometers, the porous upper layer residing over a layer having a thickness of approximately 100 nanometers.

7. The method of claim 1, wherein the sputtering pressure is increased by a factor of approximately 10.

8. A method of providing a supporting plate with a metal pattern which is light-reflecting at the side facing the supporting plate and light-absorbing at the other side, the metal pattern having a porous upper layer, the method comprising depositing the metal by sputtering, increasing the sputtering pressure during deposition to provide the porous upper layer, and oxidizing the porous upper layer after sputtering.

9. The method of claim 8, further comprising the step of selecting the metal from at least one of chromium, tungsten, molybdenum or tantalum.

10. The method of claim 9, wherein the sputtering step comprises using only one metal.

11. The method of claim 8, further comprising employing the metal pattern as connection metallization of at least one of a switching element or a picture element.

12. The method of claim 8, wherein the sputtering and oxidation steps are performed so as to provide a porous upper layer having reflectivity of about 5% or less.

13. The method of claim 8, wherein the sputtering and oxidation steps are performed so as to form a porous upper layer having a thickness of approximately 150 nanometers, the porous upper layer residing over a layer having a thickness of approximately 100 nanometers.

14. The method of claim 8, wherein the sputtering pressure is increased by a factor of approximately 10.

* * * * *